CONTACT STRUCTURES FOR LARGE TRANSISTORS

Filed Jan. 20, 1960

HAROLD LEWIS ARMSTRONG,
INVENTOR

BY Spensley and Horn
ATTORNEYS.

United States Patent Office 3,124,640

Patented Mar. 10, 1964

3,124,640

CONTACT STRUCTURES FOR LARGE TRANSISTORS

Harold Lewis Armstrong, Kingston, Ontario, Canada, assignor to Pacific Semiconductors, Inc., Culver City, Calif., a corporation of Delaware Filed Jan. 20, 1960, Ser. No. 3,621
5 Claims. (Cl. 174—72)

This invention relates to semiconductors and more particularly to an improved method and means for making close-spaced contacts to semiconductor devices.

The present invention deals with semiconductor devices and is particularly concerned with multi-junction devices, such as transistors, tetrodes, and the like. In the type of transistor with which this invention is particularly concerned, emitter and collector rectifying junctions or barriers are produced by establishing alternate regions of opposite conductivity type contiguous to an N or P-type region of semiconductor material.

The term "semiconductor material" as utilized herein is considered generic to germanium, silicon, and germanium-silicon alloys, and compounds including indium-antimonide, gallium-antimonide, aluminum-antimonide, indium-arsenside, gallium arsenide, gallium-phosphorus alloys and indium-phosphorus alloys, and the like.

The term "active impurity" is used to denote those impurities which affect the electrical rectification characteristics of semiconductor materials as distinguished from other impurities which have no appreciable effect upon these characteristics. Active impurities are ordinarily classified as donor impurities such as bismuth, phosphorus, arsenic or antimony, or acceptor impurities such as boron, aluminum, gallium or indium.

A region of semiconductor material containing an excess of donor impurities and yielding an excess of free electrons is considered to be an impurity-doped N-type region. An impurity-doped P-type region is one containing an excess of acceptor impurities resulting in a deficit of electrons, or an excess of holes. Stated differently, an N-type region is one characterized by electron conductivity, whereas a P-type region is one characterized by hole conductivity.

A heavily doped region of N-type conductivity may alternately be referred to as an $N^+$ region, the + indicating that the concentration of the active impurity in the region is greater than the minimum required to determine the conductivity type. Similarly, a $P^+$ type region would indicate a more heavily than normal doped region of P-type conductivity.

When a continuous solid crystal specimen of semiconductor material has an N-type region adjacent to a P-type region, the boundary between the two regions is termed a P-N or an N-P junction, or simply a junction.

A transistor has at least two such junctions; if a P-type conductivity region separates two N-type conductivity regions it is termed an N-P-N transistor. Conversely, if an N-type conductivity region separates two P-type conductivity regions it is termed a P-N-P transistor. The present invention is clearly applicable to both, but for the sake of clarity and simplicity will be discussed with reference to an N-P-N device.

It is well-known that a very thin base region for transistors is dictated by the physics of transistor action in order to produce transistors having a useful high-frequency power output. Transistors for operation at high-current density also require thin base layers or regions. The use of a thin base region presents the problems of making a satisfactory low resistance ohmic contact thereto. In particular, the lead must be attached to the very thin base region without making an electrical short to the emitter, collector or other regions. In addition, in order to produce transistors of high-current capability it is necessary to provide good heat transfer at the contacts to the various regions thereof.

One prior art transistor design includes closely spaced interleaved base and emitter structures and contacts thereto. Such interleaved base and emitter contacts have typically been made by alloying or by evaporating and alloying suitable metals upon the semiconductor wafer. The collector side of the transistor in accordance with these prior art techniques is usually directly mounted upon a metal header by soldering or the like.

Certain disadvantages are encountered with these prior art techniques. For example, it has proved difficult to control the alloying of small intricate structures. In addition, mounting by solder alone to a header plate does not achieve optimum heat transfer characteristics. Also, in conventional construction the emitter and base contacts contribute little or nothing to cooling. Also, stresses due to differential expansion can be troublesome especially for large structures.

Accordingly, it is a primary object of the present invention to provide improved semiconductor devices having closely-spaced large-area electrical contacts and a method of making the same.

It is another object of the present invention to provide an improved semiconductor device of high-current capabilities having efficient heat transfer characteristics at the electrical contacts to the various regions of the semiconductor wafer.

A further object of the present invention is to provide a transistor having such improved electrical and mechanical contacts.

Another object of the present invention is to provide an improved transistor capable of operation at high-current densities.

It is another object of the present invention to provide an improved semiconductor device having means for the circulation of a coolant past the portions of the device which require efficient heat transfer characteristics.

Still another object of the present invention is to provide a novel method and means for obtaining large-area electrical contacts to the various regions of a semiconductor device.

It is a still further object of the present invention to provide an efficient method and means for affixing collector, emitter and base contacts to semiconductor devices.

Yet another object of the present invention is to provide an improved method and means for obtaining electrical contacts to the various regions of semiconductor devices without having electrical shorts between the various regions.

It is a still further object of the present invention to provide an improved method and means for forming large-area electrical contacts to the various regions of semiconductor devices, which contacts are unaffected by stresses due to the differential expansion of the various portions of the devices.

The present invention provides an improved method and means for forming electrical contacts to the various regions of semiconductor wafers required for high-current capability transistors and such devices, and includes a novel geometry for such electrical contacts and a method for forming such contacts. The present invention also provides a novel and improved geometry for semiconductor devices which includes interleaved members which are spaced apart and attached to the various portions of the semiconductor devices.

The novel features which are believed to be characteristic of the invention, together with further objects and advantages thereof, will be better understood from the following description considered in connection with the accompanying drawing in which the invention is illustrated by way of example. It is to be expressly understood, however, that the drawing is for the purpose of illustration and description only, and is not intended to be definitive of the invention.

Figures 1, 2, 3, 4, 5, 6:
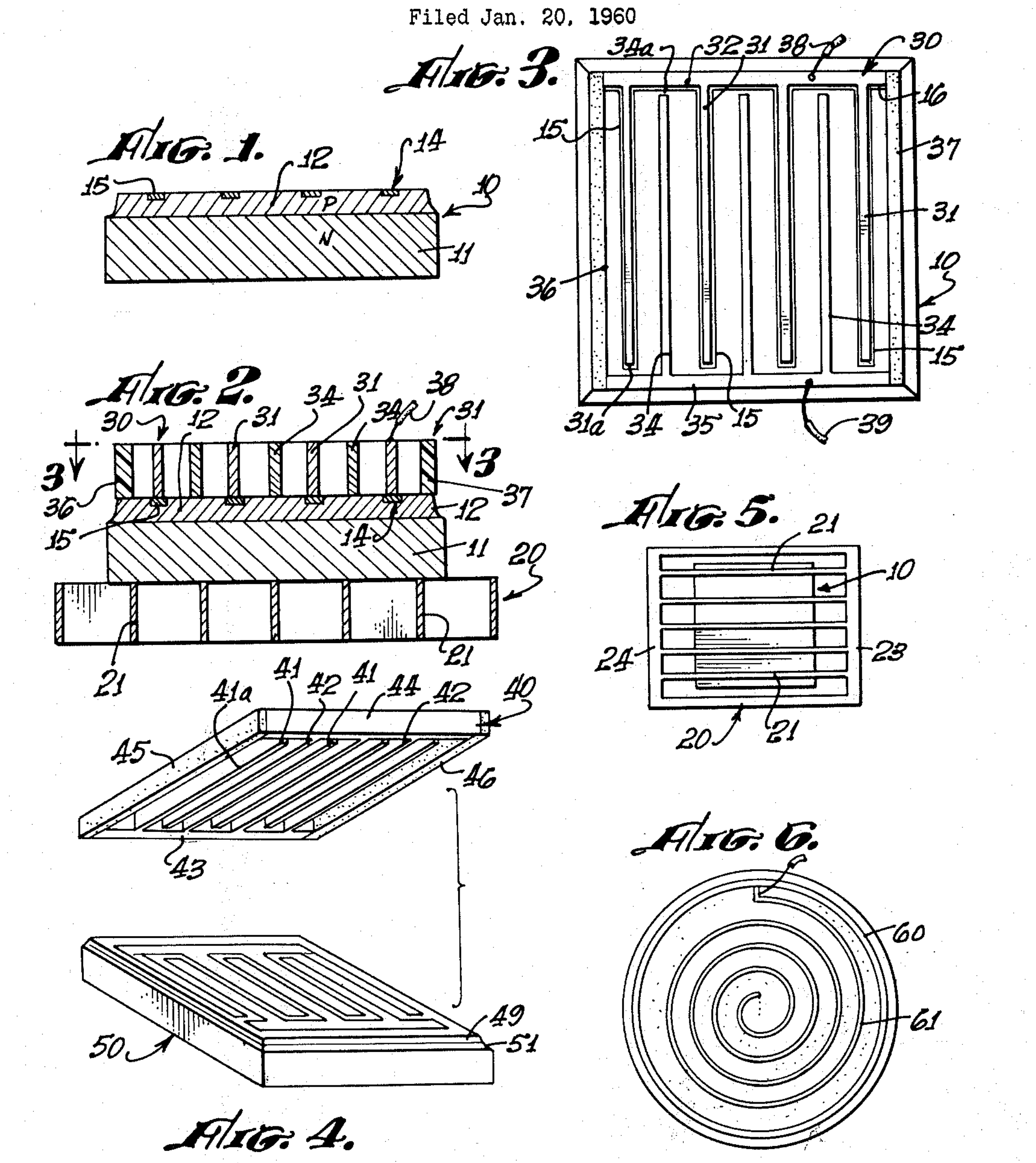
FIGURE 1 is a view in elevation of a semiconductor wafer having the various junction regions formed therein to provide a transistor.
FIGURE 2 is a plan view of a partially completed transistor with the base and emitter contacts formed in accordance with the present invention.
FIGURE 3 is a view corresponding to FIGURE 1 taken along line 3—3 of FIGURE 2.
FIGURE 4 is a view in perspective illustrating a first alternative embodiment of the present invention.
FIGURE 5 is a plan view of a collector contact as a second alternative embodiment of the present invention.
FIGURE 6 is a third alternative embodiment used as a collector contact.

Although the present invention is applicable to the formation of electrical contacts to many geometries of various semiconductor devices, an interleaved N-P-N transistor will be described throughout the specification as illustrative. Accordingly, there is shown in FIGURES 1, 2 and 3 an N-P-N silicon transistor in intermediate stages of production. In the illustrative embodiment the various regions of conductivity are formed by solid state diffusion since this method, which is well-known to the art, provides a very suitable procedure for the introduction of controlled amounts of impurities into localized regions of silicon. The diffusion process is adaptable to the formation of uniform junctions of very shallow penetration, which are required for the emitter and base regions. A deep junction, accurately parallel to the silicon surface, can also be obtained for the collector contact region. Thus, referring to FIGURE 1, as an example, the collector contact diffusion is performed first on an N-type silicon wafer to form an N+ collector region 11 extending to the lower surface of the wafer. The collector contact diffusion can be performed as an open-tube diffusion using phosphorus as the impurity. A P-type base region 12 is then diffused by well-known methods to extend from the upper surface of the crystal 10 downward to a predetermined depth. Such a P-type base region can be formed by diffusing a controlled amount of boron into the silicon wafer by a two-step diffusion technique.

A comb electrode structure is formed by diffusing the emitter region 14 as a parallel series of N-type strip regions which are connected at one end thereof. That is, as shown in FIGURES 1 and 3, the emitter is a series of N-type parallel strips 15 diffused into the P-type base region. The strips 15 are connected at one end by a transverse strip 16. Such structures can be produced by any of a large variety of techniques. For example, the comb emitter structure can be determined in the diffusion process by masking techniques. One such technique utilizes the oxide layer produced on the surface of the silicon during the base layer diffusion. In order to diffuse the emitter in the form of connected parallel strips it is necessary to remove this boro-silicate glass in strips where it is desired to diffuse the emitter into the silicon. Phosphorus, for example, can then be diffused into the silicon surface in the required configuration with the undisturbed remaining oxide glass acting as a mask or resist to the phosphorus emitter diffusant.

Thus, as shown in FIGURES 1 and 3 an illustrative transistor having a P-type base region 12, a series of parallel emitter regions 14, and N to N+ collector region 11. The base region 12 extends to the upper surface of the wafer between the emitter strips 15.

Electrical contacts to the collector, base, and emitter regions of the transistor are then made in accordance with the present invention to form contacts having high-current capacity characteristics with good cooling and mechanical properties. In accordance with the present invention, contact to the regions is made by means of an electrical conductor which includes a plurality of spaced-apart fins with an edge of the fins lying substantially in a common plane. The fins are joined together by means of a frame to form a unitary assembly. Referring to FIGURE 5 there is shown a single electrical contact assembly 20 utilized as the collector contact of the illustrative transistor assembly. That is, the conductor shown in FIGURE 5 is adapted to contact only a single region of the semiconductor. The conductor 20 of FIGURE 5 includes spaced-apart substantially parallel fins 21 formed of electrically conducting material such as silver. The fins 21 are connected by end members 23 and 24 which define a frame. The end members are also formed of silver in the embodiment shown, and the overall size of the conductor is substantially greater than the collector area of the semiconductor body 10. The height of the fins will be determined by the current carrying and cooling requirements. Those shown in the illustrative embodiment are approximately one-half inch in height, although typical heights can be as little as forty mils. The thickness of the fins varies also according to current carrying and cooling requirements and also is determined by the manner of affixing the conductor to the body 10. Typical thicknesses are from three to eleven mils. Thus, the conductor is a grid of electrically and thermally conductive material formed of a plurality of fins which are substantially greater in height than thickness and with substantial spaces between the fins. The width of the spaces must be sufficient to prevent electrical shorts and to allow the passage of cooling fluid therethrough.

The conductor 20 is mechanically affixed to the collector surface of the silicon body 10 by soldering or shallow alloying by methods well-known to the art to obtain a good electrical and mechanical connection.

Referring now to FIGURES 1, 2 and 3, an embodiment of the present invention for obtaining electrical contact to the interleaved base 12 and emitter 14 regions at the upper surface of the semiconductor body 10 is shown. In this embodiment the conductor 30 must provide electrical contact to the base and emitter regions of the semiconductor body while maintaining electrical insulation therebetween. Thus, the emitter contact must be electrically connected to the parallel strips 15 of N-type material and the transverse strip 16 connecting one end of the parallel strips 15 in the P-type surface of the semiconductor body. Conversely, the base conductor must be electrically connected to the P-type surface of the semiconductor body which includes those areas extending between the N-type emitter strip. Thus, as previously described, the N-type emitter surface is formed in the P-type base surface such that the emitter region is in the form of a comb. The base surface will then also be in the form of a comb extending in interleaved relationship with the emitter region. It is essential that electrical connection be made to as large an area as possible of the emitter and base regions, but such contact must be accomplished without any electrical shorting between either the conductors which are affixed to the N and P regions or by the conductor extending across regions. That is, the emitter conductor must contact as large an area as possible of the emitter region without contacting any portion of the P-type base region and the base conductor must contact only the P-type region.

Accordingly, as shown in FIGURES 2 and 3, the present invention provides a conductor unit 31 which includes a plurality of spaced-apart fins such as those previously described which are in substantially parallel orientation. In this embodiment, however, since both the base and emitter are to be contacted, two sets of fins are utilized, with one set representing the conductor to be connected to the emitter region while the second series of fins is the conductor to be affixed to the base region. It is necessary therefore that the two series of fins be electrically insulated or isolated one from the other. Thus, as shown in FIGURE 3, a first series of fins 31 are formed and are spaced apart at the distances corresponding to the spacing between center lines of the N-type emitter region 15 of the semiconductor body. The thickness of the fins is less than the width of the emitter strips 15. The emitter fins 31 are then connected at one end thereof by an end member 32 which is electrically and mechanically affixed to the fins 31. The transverse end member 32 is oriented such that it is adapted to contact the N-type transverse strip 16 of the emitter region. Similarly, the second series of fins 34 are spaced apart at the distance corresponding to the spacing between center lines of the P-type strips 12. The thickness of the fins 34 is less than the width of the P-type strips extending between the N-type emitter strips. An end member 35 connects each of the base fins at the end thereof opposite to the end member 32. The distance between the end members 32 and 35 is slightly greater than the length of the fins 31 and 34 such that the opposed ends 31*a* and 34*a* of the emitter fins 31 and the base fins 34 respectively are slightly spaced from the opposed end members. The spacing of the fins 31 and 34 from the end members 35 and 32 respectively is sufficient to prevent any electrical shorting therebetween. Thus the emitter and base contacts of the conductor 30 are interleaved electrically conducting structures which have no electrical contact therebetween. In order to assemble the two portions into a unitary conductor structure, side members 36 and 37 are connected between the end members 32 and 35 to form a closed frame for the conductor. The side members 36 and 37 are of non-conducting material such as ceramic, and are affixed at the ends of the end members 32 and 35. Thus, the conductor in accordance with the present invention comprises a plurality of interleaved fin members which are alternatively connected to a transverse conducting member, with the transverse conducting members being joined by nonconducting side members. The conductor is accordingly in the shape of a grid with alternate members of the grid extending to a common conductor and with no electrical contact between the alternate fins. Electrical leads 38 and 39 are in turn connected to the emitter contact section and the base contact section by affixing the leads to the transverse end members 32 and 35 respectively.

Accordingly, electrical contact is made to the semiconductor body 10 by means of the conductor in accordance with the present invention by placing the conductor upon the surface of the semiconductor body 10 such that the various fin members are aligned within the appropriate regions of conductivity as shown in FIGURES 2 and 3. The conductor 30 can be affixed to the semiconductor body by any one of many techniques known to the art, as for example by alloying the fin members to the appropriate conductivity region or by gold bonding, or like processes. It should be noted that the material used for the emitter and base contact regions of the conductor will be in electrical contact with the regions of opposite conductivity type of the semiconductor device. Accordingly, the material, which must be a good electrical and thermal conductor should also be a material which is appropriate for contact to a known conductivity type. In the embodiment shown, silver is used throughout since it will not contaminate N-type or P-type regions. It should be noted, however, that the material used for the various portions of the conductor can be varied considerably to obtain different results for various applications. For example, in connection with the alternative embodiment shown in FIGURE 4 the material utilized for the fin members can be chosen to form a junction when alloyed with the semiconductor body.

Thus, referring to FIGURE 4, an alternative embodiment of the present invention is shown in which a conductor in accordance with the present invention is utilized to form a transistor from an N-P-N sandwich without the prior formation of interleaved N and P regions at the surface thereof. That is, the semiconductor body as shown in FIGURE 4 has for an example an N-type layer at the upper surface thereof, a P-type base region and an N-type collector region beneath the P-type base. The N-type emitter region extending from the upper surface of the body extends downward, for example, to a thickness of $5\times10^{-4}$ cm. and is formed by methods well-known to the art. In order to form a transistor from such a wafer it is necessary of course to provide electrical contact to the N-type emitter region, the P-type base region and the N-type collector region. The collector contact may be formed as previously described at the lower surface of the semiconductor body 50. The conductor 40 is then utilized to form both the base and emitter contacts. The conductor structure is again formed of interleaved fins as previously described, with alternate base fins 41 interleaved with emitter fins 42. The base fins 41 are connected to the end member 43 while the emitter fins 42 are connected to the base end member 44. The conductor is again formed into a unitary body by means of side members 45 and 46 which are formed of nonconducting material. The emitter and base portions of the conductor 40 are electrically insulated one from the other. Unlike the conductor 30 previously discussed, in this embodiment the base fins 41 are oriented such that the lower edge 41*a* thereof lies in a plane beneath the plane of the lower edges of the emitter fins 42. The distance by which the base fins 44 extend beneath the emitter fins 42 is approximately equal to or greater than the thickness of the N-type region 49 of the semiconductor body. Accordingly, if the conductor 40 is placed upon the semiconductor body such that the emitter fins 42 rest upon the upper surface of the semiconductor 50 the base fins 41 will extend through the N-type emitter region to the P-type base region.

Accordingly, if the conductor 40 is positioned upon the upper surface of the semiconductor body 50 and alloyed thereto by heating, for example, at a temperature of from 600° to 650° C. (which is above the eutectic of aluminum-silicon) for a required time period, the base fins 41 will penetrate the emitter region and come into electrical contact with the base region 51. In this embodiment, therefore, it is necessary that the material from which the base fins are formed be such that it will form a junction region surrounding that portion of the fins that passes through the N-type layer. Thus, aluminum is suitable for the base contact fins and when alloyed to the semiconductor body will penetrate the N-type region and come into electrical contact with the P-type base region. As it alloys and penetrates the N-type region it forms a P-type region immediately surrounding the fins such that no electrical short occurs between the various regions of the junction. That is, as the base fins 41 penetrate the N-type region they dope that portion of the region immediately adjacent to the fins to form a P-N junction area immediately surrounding the fins. The emitter contacts 42 are preferably formed of a material, such as silver, which will not contaminate the N-type emitter regions. Such silver fins shallowly alloy with the N-type region to form an electrical contact therewith.

Referring now to FIGURE 6, a further alternative embodiment is shown in which a collector contact 60 is formed that has a configuration other than parallel strips of material. In the embodiment shown in FIGURE 6 the collector contact is again formed of an elongate fin-like member, but such member is wound into a sipral 61 to provide a maximum of contact area while still allowing a spaced-apart member through which cooling fluid can be circulated.

Thus, the conductor configurations described above provide a means for forming good electrical contact with the various regions of semiconductor devices, and such conductors are adapted to the circulation of cooling fluid past the contacts to provide good thermal characteristics.

It can be seen from the foregoing that the fins present a good cooling surface for the passage of air or for a coolant such as water or other liquid. Since the fin members are thin and necessarily flexible, this structure in addition to having good heat transfer characteristics will follow the thermal expansion and contraction of the semiconductor wafer such that the problem of matching expansion coefficients is obviated.

In accordance with the present invention, interleaved conductors as described hereinabove can be formed by stacking laminae of the fins with spacer material therebetween, connecting the end members to the laminae, forming the frame by the connection of necessary side members, and dissolving the spacer material from the structure. More particularly, in order to form a conductor such as that shown in FIGURE 3, the fin members are cut to the appropriate size from material of the required thickness. The fin members are then stacked in a laminated condition with spacer material between the fin members. The spacer material is a material which will withstand brazing or soldering operations during the formation of the conductor and which can be removed from the conductor after the structure has been formed, preferably by dissolving the material. For example, suitable materials would include silver chloride crystalline material, ribbon glass, sugar, and similar materials. If silver chloride is used the first fin is laid in place and a layer of silver chloride material to the required depth is placed upon the fin. The second fin is laid in position, silver chloride positioned upon the second fin, the third is positioned, and so forth, until a lamination is obtained with alternating fin members and spacer material. The transverse members 32 and 35 in the embodiment of FIGURE 3 are brazed or soldered to the aligned ends of the fin members and furnish sufficient rigidity to support the fins in the spaced-apart configuration. The spacer material is then removed. If silver chloride is used, it can be removed by dissolution in sodium hydroxide, which will not harm the conductor structure or change its characteristics.

What is claimed as new is:

1. A conductor for forming electrical contact to a semiconductor body at a first region of one conductivity type and at a second region of another conductivity type comprising:

a first plurality of elongate fin-shaped contact members of electrically conductive material;

a second plurality of elongate fin-shaped contact members of electrically conductive material, each of said contact members having a height substantially greater than the thickness thereof, each of said contact members in first said plurality having one edge thereof adapted to contact said first region, each of said contact members in said second plurality having one edge adapted to contact said second region, said contact members in said first and second plurality being arranged in parallel relationship and alternately spaced apart;

a frame including first and second electrically conducting spaced-apart end members and first and second electrically non-conducting side members joining said end members, said first plurality of contact members electrically affixed to said first end member within said frame, said second plurality of contact members affixed to said second end member within said frame in interleaved relationship with said first plurality, said first plurality being spaced from said second end member, and said second plurality being spaced from said first end member.

2. A conductor for forming electrical contact to a semiconductor body at a first region of one conductivity type and at a second region of another conductivity type comprising:

a first plurality of elongate fin-shaped contact members of electrically conductive material;

a second plurality of elongate fin-shaped contact members of electrically conductive material, each of said contact members having a height substantially greater than the thickness thereof, each of said contact members in first said plurality having one edge thereof adapted to contact said first region, each of said contact members in said second plurality having one edge adapted to contact said second region, each of said edges of said first plurality and said second plurality lying substantially in a common plane, said contact members in said first and second plurality being arranged in parallel relationship and alternately spaced apart;

a frame including first and second electrically conducting spaced-apart end members and first and second electrically non-conducting side members joining said end members, said first plurality of contact members electrically affixed to said first end member within said frame, said second plurality of contact members affixed to said second end member within said frame in interleaved relationship with said first plurality, said first plurality being spaced from said second end member, and said second plurality being spaced from said first end member.

3. A conductor for forming electrical contact to a semiconductor body at a first region of one conductivity type and at a second region of another conductivity type comprising;

a first plurality of elongate fin-shaped contact members of electrically conductive material;

a second plurality of elongate fin-shaped contact members of electrically conductive material, each of said contact members having a height substantially greater than the thickness thereof, each of said contact members in said first plurality having one edge thereof adapted to contact said first region, each of said edges in said first plurality lying substantially in a first plane, each of said contact members in said second plurality having one edge adapted to contact said second region, each of said edges in said first plurality lying substantially in a second plane, said contact members in said first and second plurality being arranged in parallel relationship and alternately spaced apart;

a frame including first and second electrically conducting spaced-apart end members and first and second electrically non-conducting side members joining said end members, said first plurality of contact members electrically affixed to said first end member within said frame, said second plurality of contact members affixed to said second end member within said frame in interleaved relationship with said first plurality, said first plurality being spaced from said second end member, and said second plurality being spaced from said first end member.

4. A conductor for forming electrical contact to a semiconductor body at a first region of one conductivity type and at a second region of another conductivity type comprising:

a first plurality of elongate fin-shaped contact members of electrically conductive material;

a second plurality of elongate fin-shaped contact members of electrically conductive material, each of said contact members being substantially equal in length and having a height substantially greater than the thickness thereof, each of said contact members in said first plurality having one edge thereof adapted to contact said first region, each of said contact members in said second plurality having one edge thereof adapted to contact said second region, each of said edges of said first plurality and said second plurality lying substantially in a common plane, said contact members in said first and second plurality being arranged in parallel relationship and alternately spaced apart;

a frame including first and second electrically conducting spaced-apart end members and first and second electrically non-conducting side members joining said end members, said first plurality of contact members electrically affixed to said first end member within said frame, said second plurality of contact members affixed to said second end member within said frame in interleaved relationship with said first plurality, said first plurality being spaced from said second end members, and said second plurality being spaced from said first end member.

5. An improved semiconductor device comprising:

a semiconductor body, said body having a surface of one conductivity type;

a plurality of spaced-apart substantially parallel strips of another conductivity type formed in said surface, said strips of another conductivity type being joined at one end thereof by a transverse strips of said other conductivity type;

a plurality of elongate fin-shaped members affixed in electrical contact to said strips at said surface, said fin-shaped members having a height substantially greater than the thickness thereof and affixed to said strips at one edge thereof;

an end member interconnecting one end of each of said fin-shaped members, said end member being affixed to said surface within said transverse strip;

a second plurality of fin-shaped members interleaved with said first plurality but spaced therefrom, said second plurality of fin-shaped members being of a height substantially greater than the thickness thereof, said fin-shaped members being affixed at one edge thereof to the surface of said body between said strips, a second end member interconnecting one end of said second plurality, said second end member being in contact with said surface at the region of said one conductivity type;

and side members of non-conducting materials interconnecting said end members to form a frame surrounding said fin members.

References Cited in the file of this patent

UNITED STATES PATENTS

| | | |
|---|---|---|
| 2,089,830 | Grondahl | Aug. 10, 1937 |
| 2,381,025 | Addink | Aug. 7, 1945 |
| 2,684,457 | Lingel | July 20, 1954 |
| 2,689,930 | Hall | Sept. 21, 1954 |
| 2,721,965 | Hall | Oct. 25, 1955 |
| 2,813,326 | Liebowitz | Nov. 19, 1957 |
| 2,836,878 | Shepard | June 3, 1958 |
| 2,837,703 | Lidow | June 3, 1958 |
| 2,863,105 | Ross | Dec. 2, 1958 |
| 2,924,760 | Herlet | Feb. 9, 1960 |